United States Patent [19]
Tsuno

[11] Patent Number: 6,097,028
[45] Date of Patent: Aug. 1, 2000

[54] ENERGY FILTER

[75] Inventor: Katsushige Tsuno, Tokyo, Japan

[73] Assignee: JEOL Ltd., Tokyo, Japan

[21] Appl. No.: 09/032,203

[22] Filed: Feb. 27, 1998

[30] Foreign Application Priority Data

Feb. 27, 1997 [JP] Japan .................................. 9-043585

[51] Int. Cl.[7] .............................. H01J 40/00; H01J 47/00
[52] U.S. Cl. ................................... 250/305; 250/396 ML
[58] Field of Search ............................. 250/305, 396 ML

[56] References Cited

U.S. PATENT DOCUMENTS

| | | | |
|---|---|---|---|
| 4,740,704 | 4/1988 | Rose et al. | 250/396 ML |
| 5,097,126 | 3/1992 | Krivanek | 250/305 |
| 5,126,565 | 6/1992 | Rose | 250/305 |
| 5,177,361 | 1/1993 | Krahl et al. | 250/305 |
| 5,811,801 | 9/1998 | Tsuno | 250/305 |

OTHER PUBLICATIONS

"High–Resolution imaging magnetic energy filters with simple structure", S. Lanio, *OPTIK*, 78, No. 3, (1986), pp. 99–107.
"Design of an omega filter for a 200 kV electron microscope", K. Tsuno and E. Munro, *Rev. Sci. Instrum.*, 68 (1), Jan. 1997, pp. 109–115.

*Primary Examiner*—Bruce C. Anderson
*Attorney, Agent, or Firm*—Webb Ziesenheim Logsdon Orkins & Hanson, P.C.

[57] ABSTRACT

There is disclosed a highly isochromatic electron spectroscopic imaging filter providing good energy resolution even in a microscope image having a wide field of view. To reduce the difference in energy between the vicinity of the center of the image on the pupil plane and peripheral portions, the relation $LL/L_5 >$ is satisfied, where LL is the distance from the pupil plane to the slit plane S and $L_5$ is the distance from the exit end surface of the filter to the slit plane S.

5 Claims, 10 Drawing Sheets

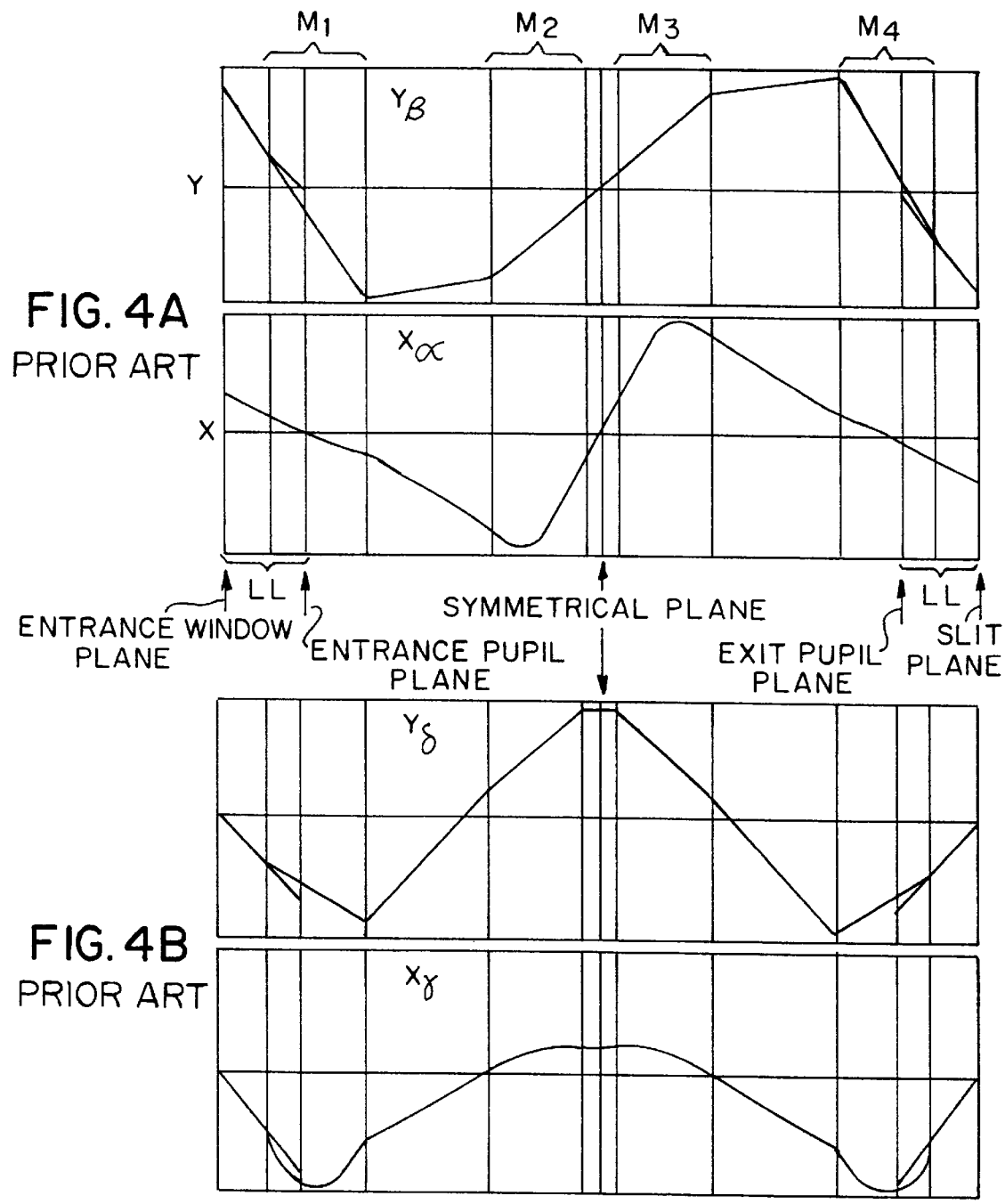

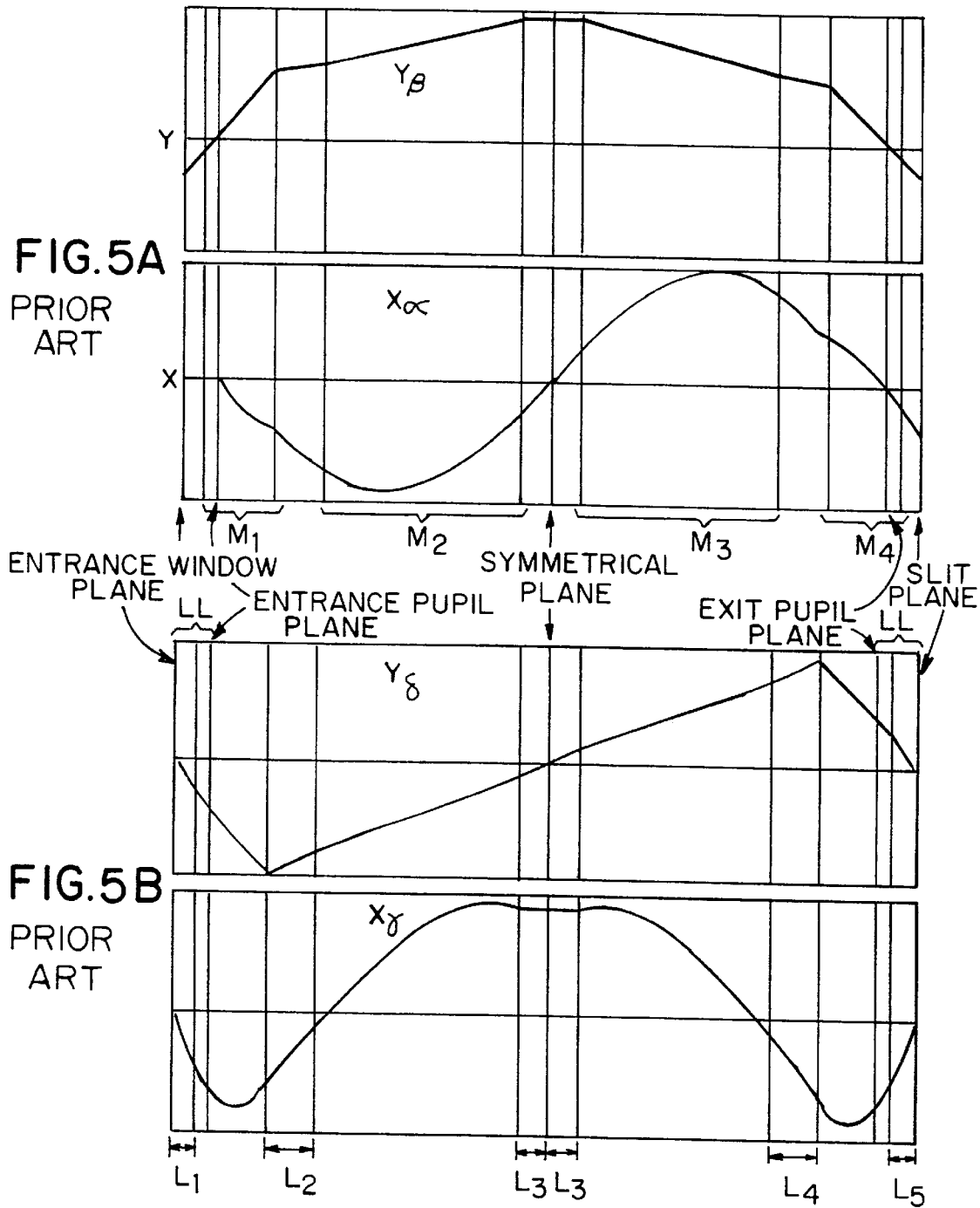

ELECTRON BEAM SHAPES ON THE SLIT PLANE

ELECTRON BEAM SHAPES PASSED THROUGH THE SLIT

ELECTRON BEAM SHAPES ON THE EXIT PUPIL PLANE

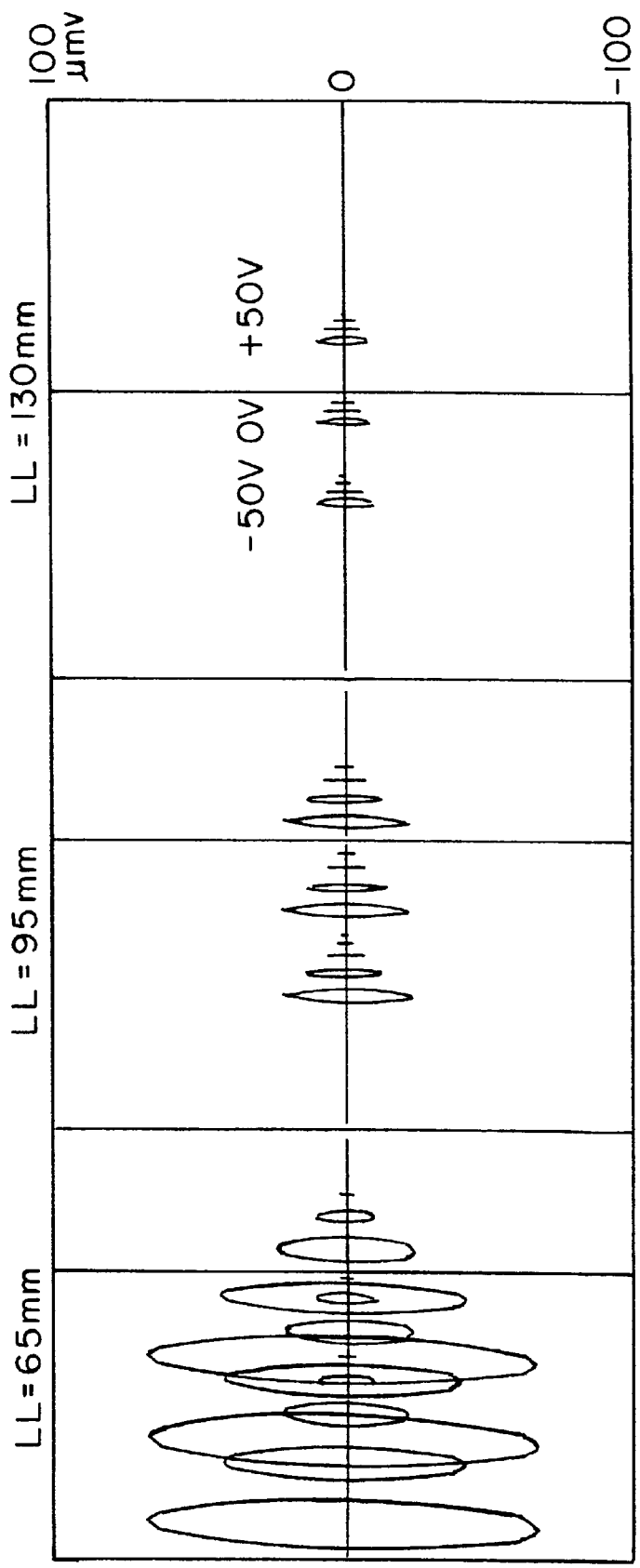

ENERGY FILTER

FIELD OF THE INVENTION

The present invention relates to an energy filter for conducting electron spectroscopic imaging (ESI).

DESCRIPTION OF THE PRIOR ART

FIG. 1 is a diagram illustrating one example of the structure of an electron microscope having electron optics incorporating an omega-type energy filter. FIG. 2 is a diagram illustrating the geometry of an omega-type energy filter of type A. FIG. 3 is a diagram illustrating the geometry of an omega-type energy filter of type B. FIGS. 4A and 4B are diagrams illustrating the fundamental orbit in the omega-type energy filter of type A. FIGS. 5A and 5B are diagrams illustrating the fundamental orbit in the omega-type energy filter of type B. FIG. 6 is a diagram illustrating geometrical figures on a specimen plane, the relations between an image on a pupil plane and the shape of an electron beam on a slit plane, and so on.

This microscope having electron optics including the omega-type energy filter has an electron gun 11 producing an electron beam as shown in FIG. 1. The beam is directed at a specimen 14 through condenser lenses 12 and through an objective lens 13. An image of the specimen is projected onto a fluorescent screen 20 through an intermediate lens 15, an entrance window 16, an omega-type energy filter 17, a slit (exit window) 18, and a projector lens 19.

In this omega-type energy filter 17, four magnetic fields $M_1$, $M_2$, $M_3$, and $M_4$, where the beam has radii of curvature $R_1$, $R_2$, $R_3$, and $R_4$, respectively, are arranged to form an $\Omega$-shaped orbit. These four fields have a deflection angle of $\Phi$. The electron beam is passed through these magnetic fields in turn such that the outgoing beam is aligned with the incident beam. FIG. 2 shows an example of the shape of the polepieces of the type A and an example of the electron orbit. FIG. 3 shows an example of the shape of the polepieces of the type B and an example of the electron orbit.

These two examples shown in FIGS. 2 and 3 are designed under different optical conditions. Let z be the direction of the optical axis of electrons. Let y be the direction of the magnetic fields. Let x be the direction parallel to a magnetic polepiece plane perpendicular to both directions z and y. In the geometry shown in FIG. 2, focusing takes place three times in the direction x parallel to the magnetic polepiece plane and also in the magnetic field direction y. This geometry is known as type A. In the geometry shown in FIG. 3, focusing occurs three times in the direction x and twice in the magnetic field direction y. This geometry is known as the type B. Their difference in fundamental optics is seen from FIGS. 4A, 4B, 5A and 5B depicting the orbits in the types A and B, respectively. In these figures, the optical axis is shown to be modified to a straight line.

The intermediate lens 15 is placed immediately before the filter so that the beam converges at a plane. This plane is referred to as the entrance window plane I. A plane which is placed immediately behind the filter and in which a slit is inserted is referred to as the slit plane S, or exit window plane. The filter starts with the entrance window plane I and terminates at the slit plane S. Let $x\gamma$ and $y\delta$ be orbits having a height of zero in these two planes, respectively. These orbits $x\gamma$ and $y\delta$ pass through the center of the optical axis in these two planes, respectively. Let $x\alpha$ and $y\beta$ be orbits having nonzero heights in these two planes, respectively. That is, these orbits $x\alpha$ and $y\beta$ do not pass through the center of the optical axis in these two planes, respectively. When the electron microscope is adjusted so that a diffraction pattern is projected onto these two planes, an image is focused on the fluorescent screen 20. A virtual image is created before the slit, i.e., closer to the center of the filter than the slit. A round lens, or the projector lens 19, placed behind the slit creates a real image projected on the fluorescent screen 20. The plane at which the virtual image is formed is referred to as the pupil plane. The virtual image on the pupil plane has achromatic nature and does not depend on the energy of the beam. On the other hand, in the slit plane, dispersion takes place according to the energy of the beam. Hence, the image has isochromatic nature.

To make some second-order aberrations zero and to reduce the remaining aberrations, the omega-type energy filter is so designed that the beam orbit is symmetrical with respect to the symmetrical plane between the second magnetic field $M_2$ and the third magnetic field $M_3$ Expressed by the eikonal method, five of the 18 second-order aberrations are zero and, therefore, the remaining 13 aberrations are nonzero. Let LL be the distance from the exit pupil plane to the slit plane. The instrument is adjusted, using the intermediate lens 15, so that the entrance pupil plane is located the distance LL from the entrance window plane.

Under these conditions, the types A and B differ as follows. With respect to type A, in the orbit in the direction y (i.e., the direction of the magnetic fields), the relations $y\beta=0$ and $y\delta'=0$ hold on the symmetrical plane as shown in FIGS. 4A and 4B. With respect to type B, the relations $y\beta'=0$ and $y\delta=0$ hold on the symmetrical plane as shown in FIGS. 5A and 5B. In these equations "'" indicates a differentiation with respect to z or the direction of the optical axis of the electrons. In other words, "'" denotes the inclination of the orbit. The x-orbit is the same for both types and given by $x\alpha=0$ and $x\gamma'=0$ on the symmetrical plane.

If these conditions are selected, focusing of the $x\gamma$-orbit takes place three times for the type A as shown in FIGS. 4A and 4B. Also, focusing of the $y\delta$-orbit occurs three times. With respect to type B, however, focusing of the $x\gamma$-orbit takes place three times but focusing of the $y\delta$-orbit occurs only twice as shown in FIGS. 5A and 5B. This inverts the image. That is, a mirror image is created. It has been known for many years that these two kinds of omega-type energy filters exist. All the energy filters developed heretofore, excluding those developed by Applicant, are of type A, because type B produces greater second-order aberrations, as explained by Lanio in "High-Resolution Imaging Magnetic Energy Filters with Simple Structure", *Optik*, 73 (1986), pp. 99–107.

The omega-type filter shows symmetry with respect to the symmetrical plane. Because of this symmetry, the filter can cancel out the second-order aberrations almost completely on the exit pupil plane. Where the omega-type filter is employed, a quite great advantage to an imaging filter is obtained. That is, a distortionless image is readily obtained on the pupil plane without blurring the image.

Geometrical figures on a specimen image, the relation between an image on the pupil plane and the shape of the electron beam on the slit plane, and so on, are next described with reference to FIG. 6. In FIG. 6, A indicates some concentric figures drawn on the specimen plane. B indicates than an electron beam carrying information about the figure drawn on the specimen plane is brought to a focus on the objective back focal plane. C shows the beam projecting the focal point onto the entrance window plane through an intermediate lens, the focal point being located on the objective back focal plane. E indicates the images projected onto the entrance pupil plane by manipulating the intermediate lens as described above, the images being drawn on the specimen plane. Let $r_i$ be the radius of the greatest one of the concentric circles of the images.

D indicates the geometrical relations among the size of the beam on the entrance window plane, the size of the image on the entrance pupil plane (having the radius $r_1$), and the distance LL between both planes.

F shows that the images on the entrance pupil plane are projected onto the exit pupil plane through the filter without modification. In A–F above, the images and beam are drawn with uniform magnification and uniform size to help understanding. Neither the images nor the beam is distorted up to this point. Also, almost no blurring is observed.

G shows the shape of the beam on reaching the slit plane after leaving the exit pupil plane. It can be seen that the beam is distorted into a triangular form. H is an enlargement of G and drawn corresponding to the concentric images on the pupil plane. This revels that a more outer circular image (strictly an image showing the peripheries of a circle) in F appears shifted to the left in H.

In this way, on the slit plane, outer beams in the field of view appear shifted in the direction of dispersion of the beam, i.e., to the left, relative to the beams close to the center of the field of view due to coma-like aberrations. Therefore, if the slit width is not set large, a wide field of view is not imparted to the final microscope image. However, if the slit width is increased, energy differs between the center of the field of view and peripheral portions within the same field of view, because the aberration compensation owing to the symmetry with respect to the symmetrical plane produces almost no effect on the slit plane. Accordingly, it is important to reduce the aberrations on the slit plane in optimizing the geometry of the omega-type energy filter.

Where such an energy filter is inserted into the imaging lens system of a transmission electron microscope and electron energy loss spectroscopy (EELS) is effected, the energy resolution is on the order of eV. EELS performs an energy analysis at a given location within an electron microscope image and identifies substances present at this given location. Therefore, it is required that the energy resolution be high. On the other hand, electron spectroscopic imaging (ESI) needs uniform beam energy from the vicinity of the center of the image to peripheral portions to create the image, as well as high energy resolution. In the peripheral portions, the beam shows large divergence angles. That is, electron energy loss spectroscopy necessitates only high isochromatic nature. However, electron spectroscopic imaging requires both isochromatic nature and achromatic nature.

FIG. 7 shows electron orbits in the prior art omega-type energy filter and the shapes of the electron beam on the symmetrical plane, on the pupil plane, and on the slit plane. FIGS. 8A, 8B and 8C show the shapes of the beam on the pupil and slit planes where the beam divergence angle is 0.75°, 0.5°, 0.25° and 0.125°.

In the example of FIG. 7, an incident beam with 200 kV suffered an energy loss of 2 kV. The shapes of the beam at various portions of the filter are drawn. The divergence angle of the beam is 0.75°, which corresponds to the above-described γ and δ. The energy undergone the energy loss follows an orbit different from the orbit of the direct beam. However, they are brought to a focus at the same position on the pupil plane. The beam is dispersed according to the energy on the slit plane. A slit is inserted into the position S (FIG. 7) to select a desired energy range.

In FIG. 7, DD gives an extreme example in which a beam suffering an energy loss of as much as 2 kV is drawn. The shape of the beam is distorted due to aberrations. Therefore, the energy loss beam does not completely coincide with the zero-loss beam (direct beam). Comparison of the symmetrical plane BB of FIG. 7 with the beam on the pupil plane DD shown in FIG. 7 shows that the beam shape differs from location to location within the filter. In the examples shown in FIG. 7, it is assumed that the beam takes only one divergence angle. In practice, of course, the divergence angle is made to vary continuously over a certain range in order to obtain a microscope image with a certain field of view.

FIGS. 8A and 8C show the shapes of the beam on the pupil plane and on the slit plane, respectively, where the beam divergence angle is 0.75°, 0.5°, 0.25° and 0.125°. The five vertically aligned beam shapes indicate focusing variations. The solid lines indicate zero-loss beams (direct beams). The broken lines indicate 100 V-energy-loss beams. FIG. 8B shows only the beam passed through the slit S shown in FIG. 8C, the beam being included in the beams on the pupil plane shown in FIG. 8A.

It can be seen from FIG. 8A that as the beam divergence angle increases, the beam on the pupil plane increases in size while maintaining the circular form. It is observed that the zero-loss beams (direct beams) indicated by the solid lines agree well with the energy-loss beam indicated by the broken lines. As shown in FIG. 8C, the beam on the slit plane increases in size and shifts to the left with increasing the divergence angle. The third beam from the top is just brought to a focus. This beam is vertically elongated and narrow. As the beam goes out of focus, it becomes wider. In this way, this filter has large aberrations similar to the coma in the round lens.

A case in which a microscope image is photographed on a film placed at the position of the fluorescent screen shown in FIG. 1 is next discussed. The film has a diagonal diameter of 170 mm. The film measures 120×120 mm. The total magnification of the projector lens is 100×. The virtual image on the exit pupil plane of the filter is exposed to the film up to a diameter of 1.7 mm (radius of 0.85 mm). This corresponds to the beam hitting the slit plane at an angle of approximately 0.75°. If the dispersion is 1.1 μm/eV, the 100 V-energy-loss beam deviates 0.11 mm from the direct beam on the slit. However, as shown in FIG. 8C, the beam on the slit plane shifts with angle due to aberrations. Accordingly, a beam with a divergence angle lying in a certain range has a width depending on the angular range. The width of spread of the beam created by the beam of ±0.75° is 0.05 mm. In the case shown in FIG. 8C, the 100 V-energy-loss beam indicated by the dotted lines is completely separated from the direct beam indicated by the solid lines and so they can be isolated from each other.

It is assumed that the slit S is inserted to select the beam having loss energy of 50 V. This is a region surrounded by a square in FIG. 8C. The slit width is set to 0.05 mm in conformity with a width corresponding to the field of view of the direct beam, i.e., the beam divergence angle. If the slit is inserted to cover the whole region of the 50 V-energy-loss beam, then direct beams with large divergence angles from 0.75° to 0.5° and 100 V-energy-loss beams with small divergence angles from 0° to 0.5° intermingle within the slit.

The slit S is inserted into the position indicated by the square in FIG. 8C. Only the beams passed through the slit are extracted and drawn on the pupil plane. The resulting beams on the pupil plane are shown in FIG. 8B. That is, FIG. 8B shows the appearance of the obtained microscope image. Only broken lines appear from 0° close to the center up to 0.25°. Therefore, the microscope image arises from only the 100 V-energy-loss beams. The outermost microscope image emanates from the zero-loss-beams indicated by the solid lines. The second one from the outside is a microscope image originating from both kinds of energies. Of course, this relation can be shifted by varying the position of the slit. The property can be weakened by narrowing the slit width. However, it is inevitable that energies cannot be completely separated in spite of the insertion of the slit. Otherwise, the energy value may differ from location to location within the field of view of the microscope image.

This problem can be avoided by using the projector lens with a maximum magnification. For example, if the projector lens is used with a magnification 500×, the beam divergence angle is 0.15°. Hence, the above-described problem can be almost completely circumvented. However, ESI needs microscope images of varying degrees of magnification, ranging from low magnification to high magnification. This makes it impossible to set high the magnification of the lens located behind the filter at all times.

Accordingly, the present invention is intended to secure an energy resolution of about 50 eV at worst where the magnification provided behind the filter is approximately 100× (in other words, the radius of the virtual image on the pupil plane is about 0.8 mm). The invention is also intended to secure an energy resolution of about 10 eV where the magnification is set to about 200× while sacrificing the field of view somewhat.

The discussion described above applies to the case where a film having a diameter of 170 mm is used. It may be conceivable that a CCD camera measuring 1 inch×1 inch, for example, is used instead of the film. In this case, a magnification of about 20× following the filter can cover the area 1 inch×1 inch. Therefore, if the magnification provided behind the filter is set to about 100×, the radius of the used portion of the field of view of the virtual image on the pupil plane can be reduced by a factor of about 5 compared with the case discussed above. The slit can be narrowed accordingly. Consequently, the energy resolution can be improved by a factor of about 25.

SUMMARY OF THE INVENTION

The present invention is intended to solve the foregoing problems. It is an object of the present invention to provide an imaging filter producing good energy resolution even in a microscope image with a wide field of view.

This object is achieved in accordance with the teachings of the invention by an omega-type energy filter having a first magnetic field $M_1$, a second magnetic field $M_2$, a third magnetic field $M_3$, and a fourth magnetic field $M_4$ to deflect an electron beam into an Ω-shaped orbit from an entrance window to an exit window forming a slit plane. This filter is characterized in that the relation $LL/L_5>2$ is satisfied, where LL is the distance from the exit pupil plane to the exit window, or the slit plane, and $L_5$ is the distance from the exit end surface of the fourth field $M_4$ to the exit window.

In one feature of the invention, the deflection angle Φ is set to 110° to 120°.

Other objects and features of the invention will appear in the course of the description thereof, which follows.

BRIEF DESCRIPTION OF THE DRAWINGS

FIGS. 4A and 4B are diagrams illustrating the fundamental orbit of the omega-type energy filter of type A shown in FIG. 2;

FIGS. 5A and 5B are diagrams illustrating the fundamental orbit of the omega-type energy filter of type B shown in FIG. 3;

FIGS. 11A–C is a diagram showing aberrations on a slit where $L_5$ is kept at 40 mm and LL=65 mm, 95 mm and 130 mm.

DETAILED DESCRIPTION OF THE INVENTION

Figure 9:
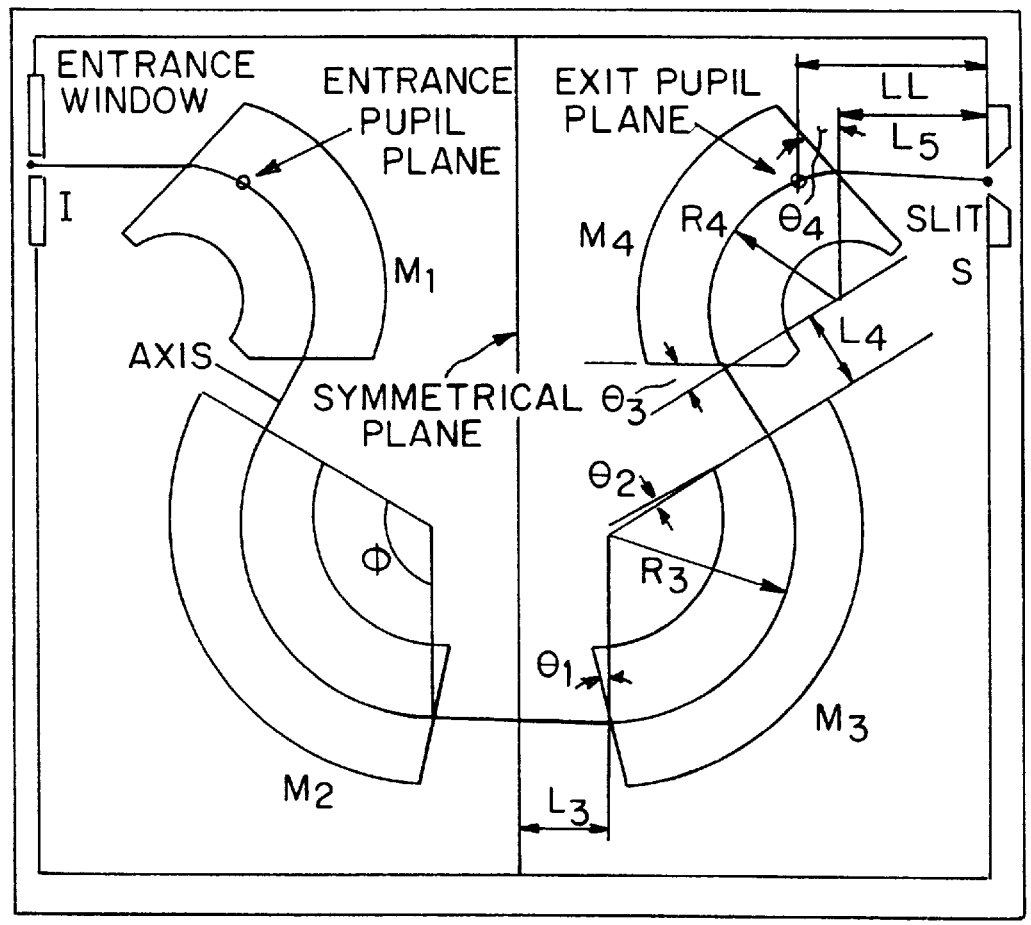
FIG. 9 is a diagram illustrating parameters used in designing an omega-type energy filter.
Figure 10:
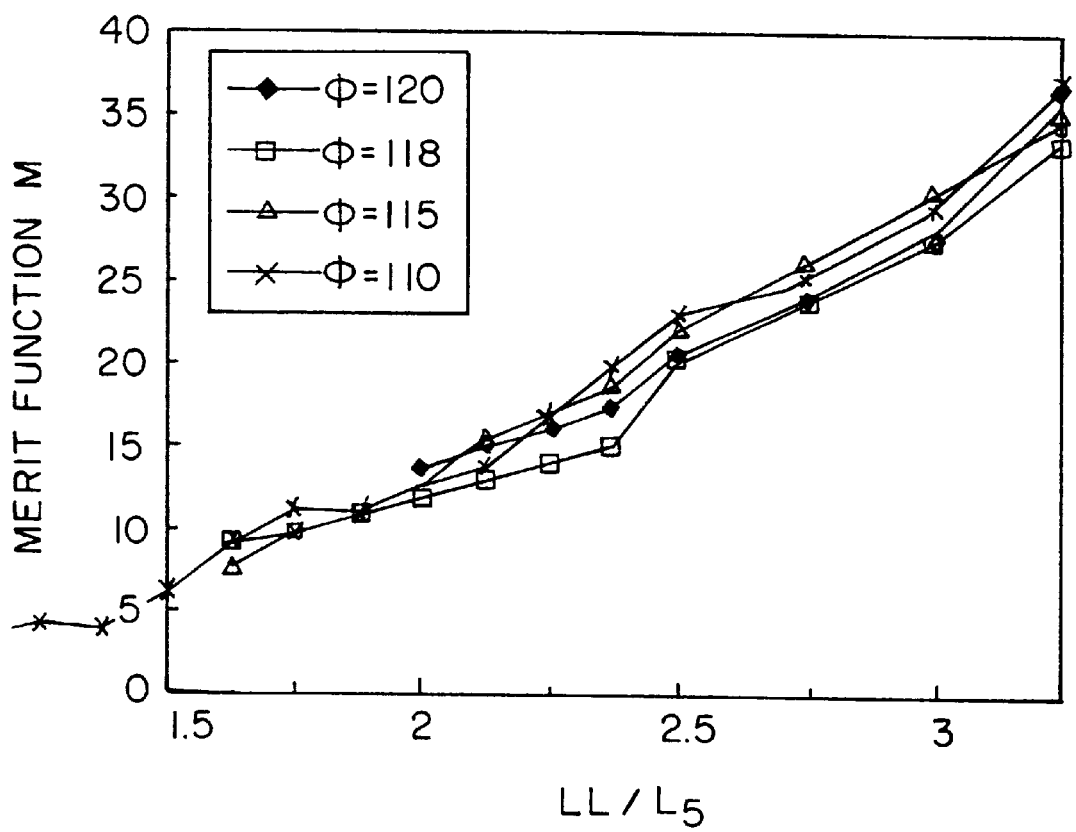
FIG. 10 is a diagram illustrating the dependences of a merit function M on parameter $LL/L_5$.

FIG. 9 is a diagram illustrating parameters used in designing an omega-type energy filter. FIG. 10 is a diagram illustrating the dependence of the merit function M on parameter $LL/L_5$. FIG. 11 is a diagram showing aberrations on a slit where $L_5$ is kept at 40 mm and LL=65 mm, 95 mm and 130 mm.

In FIG. 9, the beam shows a radius of curvature of $R_3$ in the magnetic field $M_3$ on the side of the symmetrical plane. The entrance end surface of the field $M_3$ is tilted at an angle of $\theta_1$. The exit end surface of the field $M_3$ is tilted at an angle $\theta_2$. The beam exhibits a radius of curvature of $R_4$ in the magnetic field $M_4$ on the side of the slit. The entrance end surface of the field $M_4$ is tilted at an angle of $\theta_3$. The exit end surface of the field $M_4$ is tilted at an angle of $\theta_4$. Their deflection angles are equal to φ. Let $L_3$ be the distance, or drift length, from the symmetrical plane (or the central plane) to the entrance end surface of the field $M_3$ on the side of the symmetrical plane. Let $L_4$ be the distance from the exit end surface of the field $M_3$ to the entrance end surface of the field $M_4$. Let $L_5$ be the distance from the exit end surface of the field $M_4$ on the side of the slit to the slit plane S. Let LL be the distance from the exit pupil plane to the slit plane.

The geometrical factors determining the fundamental optical characteristics of the omega-type energy filter are 11, i.e., the aforementioned radii of curvature $R_3$, $R_4$, end surface angles $\theta_1$, $\theta_2$, $\theta_3$, $\theta_4$, distances $L_3$, $L_4$, $L_5$, LL, and deflection angle Φ. Besides the distance between the actual end surface of the magnet and the effective end surface of the magnetic field, distribution can be a parameter, but this is neglected here. Of these 11 parameters, the values of the ends surface angles $\theta_1$, $\theta_2$, $\theta_3$, and $\theta_4$ are automatically determined to obtain focusing and so we have no choice.

Figure 1:
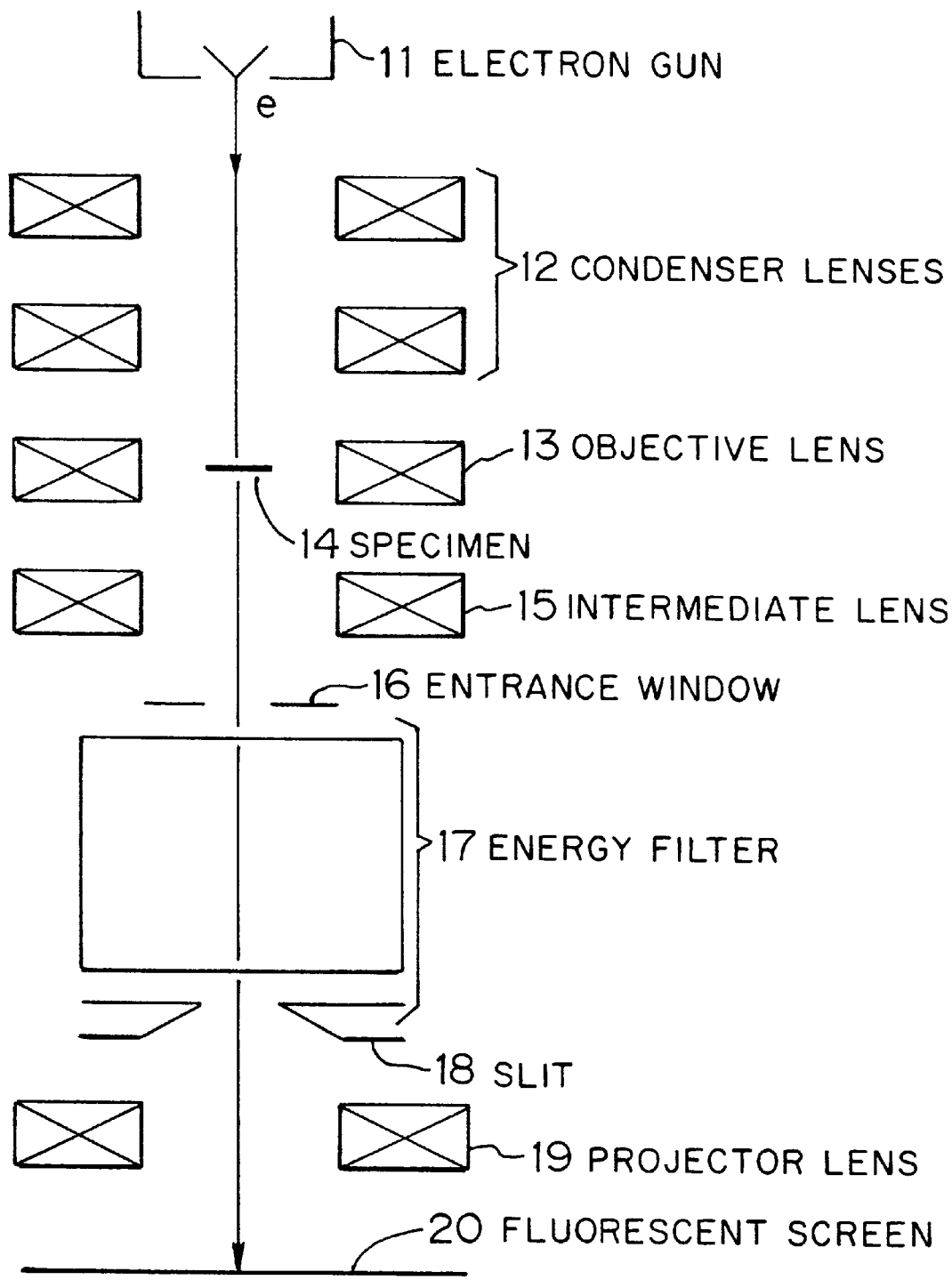
FIG. 1 is a diagram of an electron microscope having electron optics incorporating an omega-type energy filter.
Figure 3:
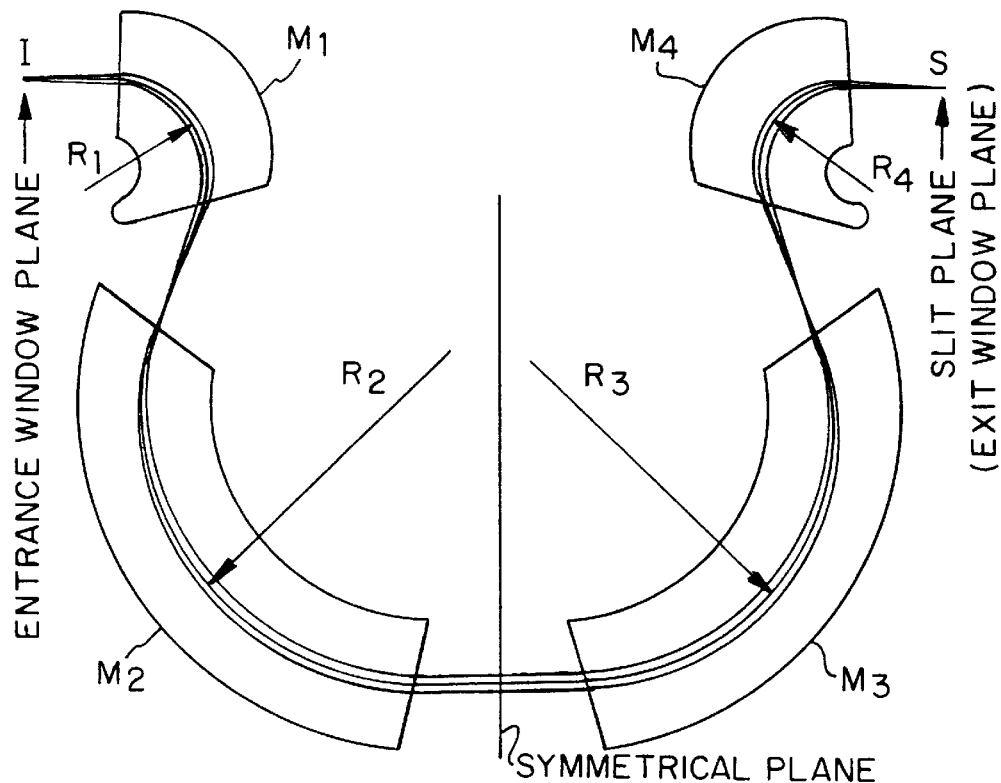
FIG. 3 is a diagram illustrating the geometry of an omega-type energy filter of type B.
Figure 2:
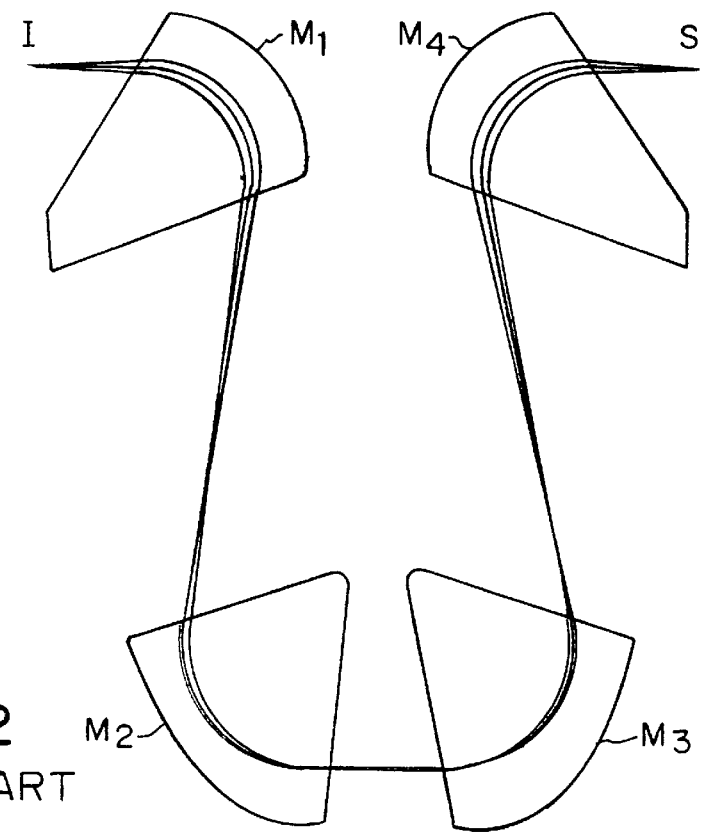
FIG. 2 is a diagram illustrating the geometry of an omega-type energy filter of type A.
Figure 6:
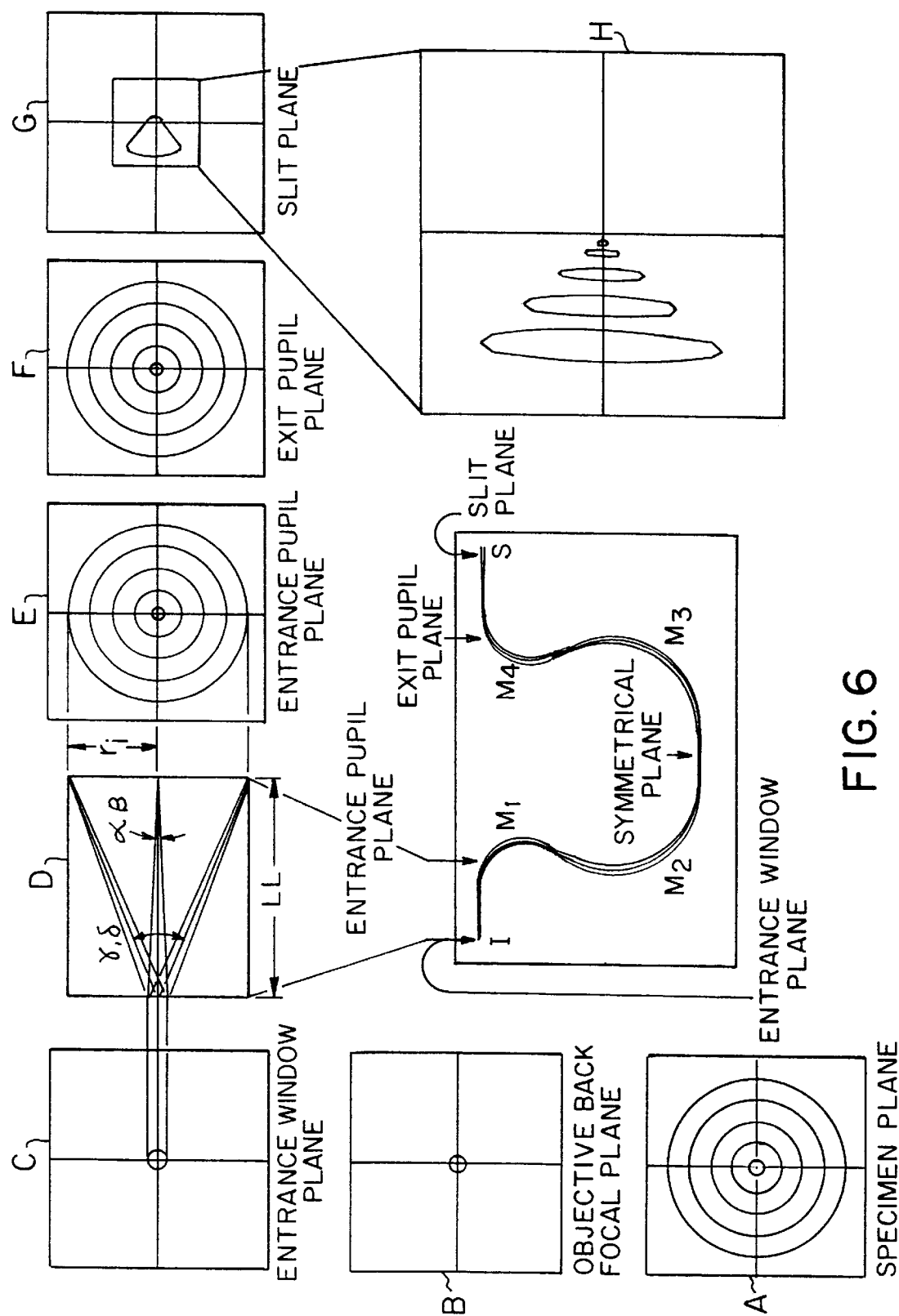
FIG. 6 illustrates geometrical figures on a specimen plane and the relation between the image on a pupil plane and the shape of the electron beam on a split plane.
Figure 7:
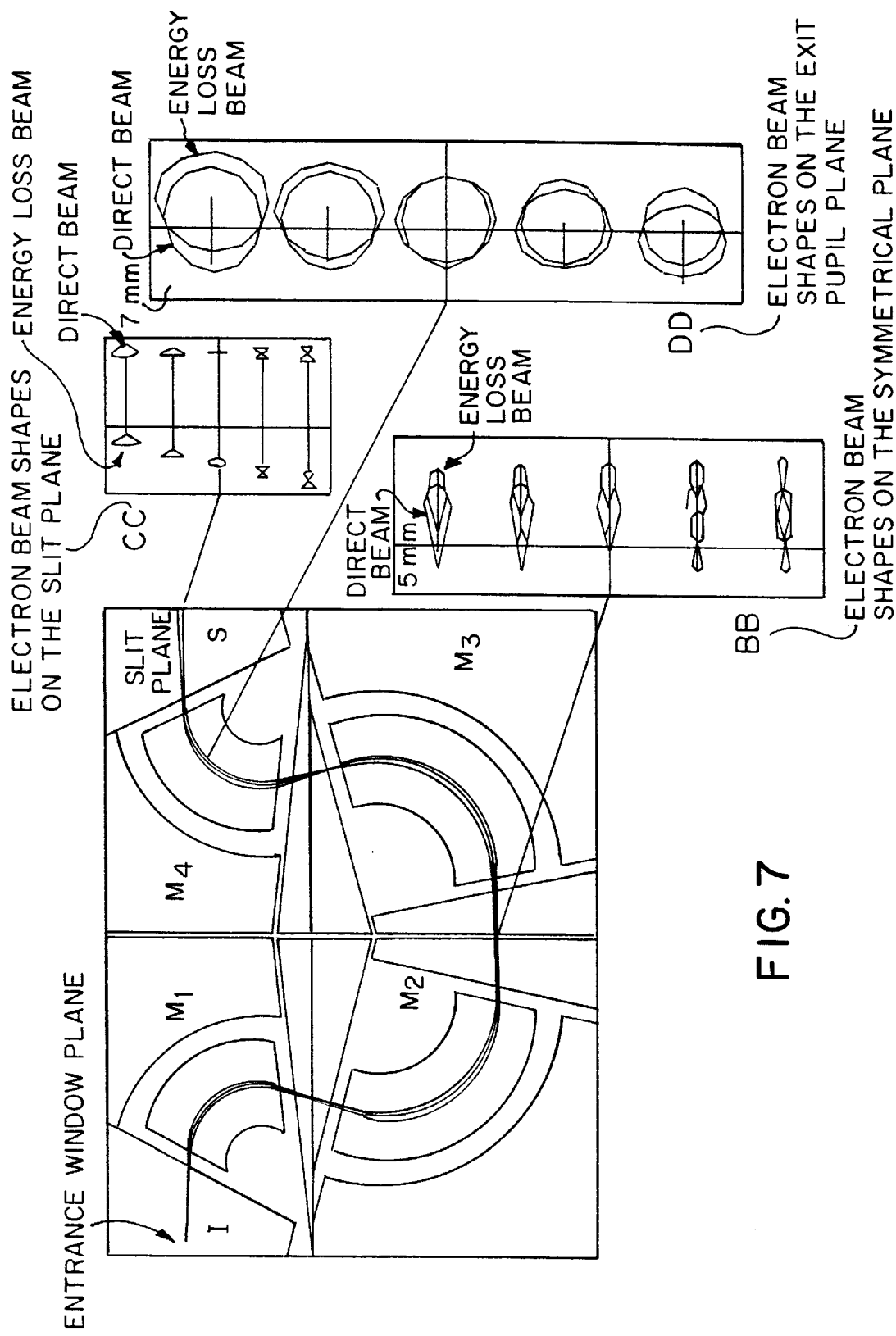
FIG. 7 illustrates electron orbits in the prior art omega-type energy filter and the shapes of the electron beam on the symmetrical plane, on the pupil plane, and on the slit plane.
Figure 8C:
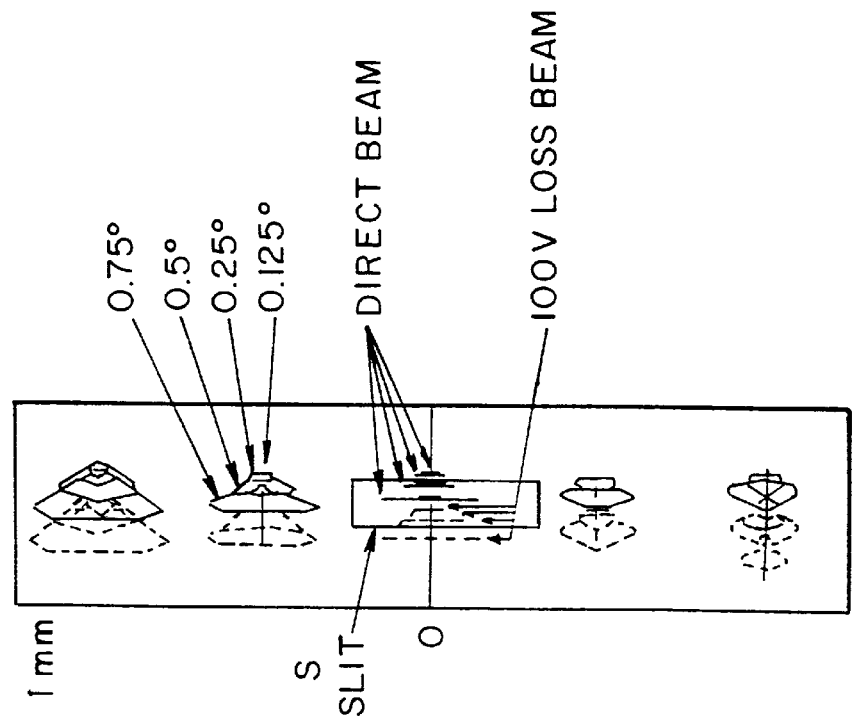
FIGS. 8A, 8B and 8C show the shapes of beams on the pupil and slit planes at beam divergence angles of 0.75°, 0.5°, 0.25° and 0.125°.
Figure 8B:
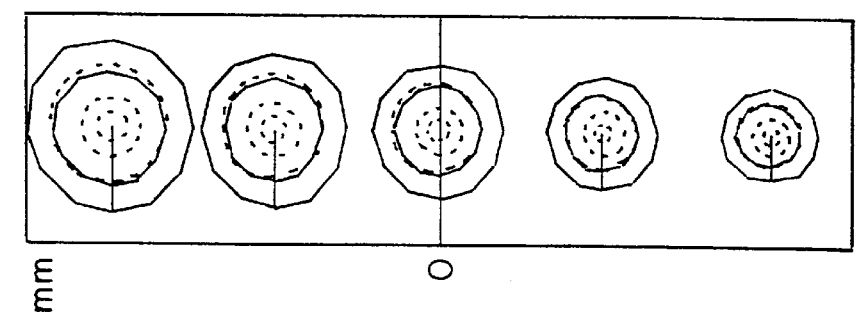
Figure 8A:
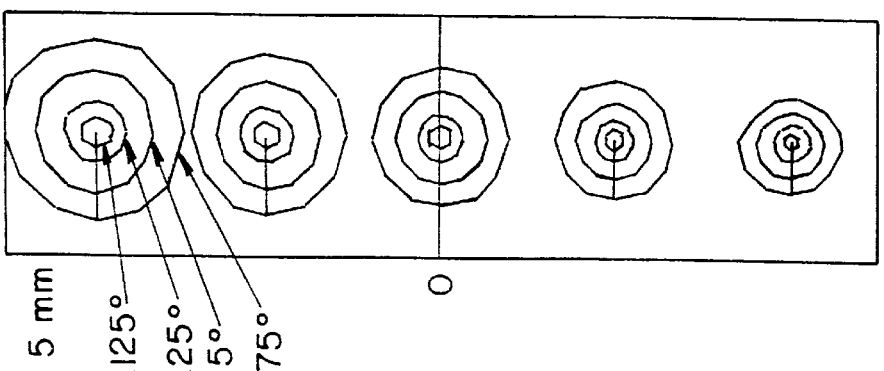

It is assumed that aberrations $\Delta X_p$ and $\Delta Y_p$ take place on the exit pupil plane and that aberrations $\Delta X_s$ and $\Delta Y_s$ occur on the slit plane. The full size of the beam containing no aberrations on the slit plane subtends angles α and β. The full size of the image on the exit pupil plane subtends angles γ and δ. The magnitudes of the aberrations $\Delta X_p$, $\Delta Y_p$, $\Delta X_s$ and $\Delta Y_s$ depend on the aberration coefficients ($A\alpha\alpha\alpha$, ..., $B\alpha\beta\beta$, $C\alpha\alpha$,) and on the subtended angles α, β, γ and δ. It is to be noted that the size of the beam on the slit plane is assumed to contain no aberrations. Therefore, the beam is not an actual beam containing aberrations. In FIG. 6, D can be referred to as an illustration for the above description. The angles α and γ are made in the x-direction, while the angles β and δ are made in the y-direction.

The size of the beam on the specimen plane is limited by the objective aperture. The beam reaching the entrance window is also limited by the magnification of the intermediate lens. Therefore, where the magnification of the intermediate lens is low, the size of the beam is about 5 μm at maximum. Where the intermediate lens is used with high magnification, the size is much smaller. Therefore, the angle that the full size of the beam on the entrance window plane subtends is sufficiently small. This beam reaches the exit pupil plane as it passes through the filter. However, on the slit plane, this beam is spread considerably due to the aberrations on the slit plane. Accordingly, we estimate the diameter of the beam on the entrance window plane to be approximately 5 μm and regard this as representing the size of the aberration-free beam on the slit plane. Assume that the distance LL is 100 mm. The angles α and β that the aberration-free beam passing through this slit subtends are $0.005/100 = 5 \times 10^{-5}$ rad. On the other hand, the angles γ and δ that the image on the pupil plane subtends are approximately $10^{-2}$ rad. Hence, they differ by a factor of 200.

The magnitude of an aberration is the product of its aberration coefficient and angle. As mentioned. previously, the angles α and β differ considerably from the angles γ and δ. Therefore, only coefficients associated with the certain large angles γ and δ almost determine the agnitude of the aberration. Consequently, onlly the aberration $\Delta X_s$ appears conlspicuously on the slit plane and can be approximated by $$\Delta Y_s = (r_i^2/LL^2)(A\gamma\gamma\gamma + B\gamma\delta\delta/2)$$

where $r_i$ is the height of the image on the pupil plane of the filter, LL is the distance from the pupil plane to the slit plane, and $A\gamma\gamma\gamma$ and $B\gamma\delta\delta$ are aberration coefficients.

Where the dispersion D is great, energy can be selected without difficulty even if the beam is spread due to aberrations on the slit plane. A merit function given by $$M = D \; r_i^2/\Delta X_s$$

can be adopted as an index representing the performance of the filter. The merit function can also be given by $$M = (D \; LL^2)/(A\gamma\gamma\gamma + B\gamma\delta\delta/2)$$

As the merit function M increases, the effect of the aberrations on the slit surface decreases.

Similarly, image blurring on the pupil plane can be approximated by $$\Delta X_p \approx (r_i \; r_a/LL_2)(B\alpha\beta\delta + B\gamma\beta\beta + C\beta\delta \times LL \times 10^{-4}/r_a)$$

where $r_a$ is the height of the image on the slit plane, $B\alpha\beta\delta$ and $B\gamma\beta\beta$ are aberration coefficients (such as distortion, spherical aberration, and other geometrical aberrations), $C\beta\delta$ is the aberration coefficient of chromatic aberration due to difference in energy. The omega-type energy filter used in the following discussion creates blurring of only about 0.2 μm on the fringes of the image. Therefore, if it is magnified by a factor of 100 by the projector lens, any problems by no means take place.

The seven geometrical parameters illustrated in FIG. 9 (i.e., the radii of curvature $R_3$, $R_4$, the end surface angles $\theta_1$, $\theta_2$, $\theta_3$, $\theta_4$, the distances $L_3$, $L_4$, $L_5$, LL, and the deflection angle Φ) were varied variously. The values of the merit function M were found for various values of $LL/L_5$. In particular, the geometrical parameters excluding the deflection angle Φ and the distance LL were varied variously, while maintaining Φ and LL constant. The best results are given in FIG. 10. It can be seen that the optimum merit function M increases roughly in proportion to $LL/L_5$. The deflection angle Φ was varied from 110° to 120°. It is observed that the merit function hardly depends on the deflection angle.

In FIGS. 11A, 11B and 11C, the height $r_i$ of the image on the pupil plane was set to 0.8, 0.5, 0.3, 0.15 and 0.05 mm. The energy was set to −50, 0, and +50 V. In practice, the energy is the deviation from a reference energy value. Aberrations produced on the slit plane are drawn in FIGS. 11A, 11B and 11C. The horizontal axis indicates the lateral direction of the slit, i.e., the direction of dispersion of energy. The vertical axis indicates the vertical direction of the slit. As shown in FIG. 11A at LL=65 mm, the aberration produced at −50 V is superimposed on the aberration produced at +50 V, as well as on the aberration produced at 0 V. As shown in FIG. 11B at LL=95 mm, the beam of 0 V is completely isolated from the beams of +50 V and −50 V. As shown in FIG. 11C at LL=130 mm, the three beams are sufficiently spaced apart.

The value of the distance LL is next discussed. Assume that the virtual image on the pupil plane that is used as a reference has a radius of 0.8 mm. The beam of 50 V can be separated if $$DE/\Delta X_s > 1$$

$\Delta X_s$ is derived from the equation expressing the merit function, i.e., $$M = D \; r_i^2/\Delta X_s$$

Thus, $$DE/\Delta X_s = (E/r_i^2)M > 1$$

Since the dispersion D is expressed in μm, it is rewritten in units of mm, resulting in $$10^{-3} \times (E/r_i^2)M > 1$$

To find the merit function, energy E=50 V and radius $r_i$ 0.8 mm of the virtual image on the pupil plane are substituted into the above equation. This condition is satisfied if M>12.8. Therefore, it can be understood from FIG. 10 that the following relationship must be met:

$$LL/L_5 > 2$$

Similarly, substituting E=10 V and $r_i$=0.4 mm into the equation leads to the conclusion that M>16. In consequence, it can be seen from FIG. 10 that the following relation must hold:

$$LL/L_5 > 2.2$$

All the estimations have been made under the condition that the accelerating voltage is 200 kV. Since $LL/L_5$ is the ratio of the lengths, the relativistically modifying factor is canceled out if the accelerating voltage is varied. Hence, this modifying factor is not necessary.

It is to be understood that the present invention is not limited to the above embodiment. Rather, various changes and modifications are possible. For example, in the above embodiment, the invention is described with reference to an omega-type energy filter. The invention can also be applied to an energy filter for performing other kinds of electron spectroscopic imaging. Specifically, in $(E/r_i^2) M>1$, the term $E/r_i^2$ is the ratio of the energy value to be separated to the field of view and does not depend on the kind of the filter. On the other hand, the merit function M is given by $M=D r_i^2/\Delta X_s$. Therefore, the aberration $\Delta X_s$ assumes a different value according to the kind of the filter. Consequently, the merit function M takes a different value. General use needs various requirements. Where only the performance is taken into account, it would be reasonable to think that a filter having small aberrations requires higher performance and that lower performance suffices for a filter with large aberrations. In this way, the extent of the requirement varies, depending on the fundamental performance of the filter. For this reason, the merit function M found for the omega-type energy filter and the relation $LL/L_5>2$ found from FIG. 10 can be applied to other kinds of energy filters. Of course, the merit function M and the relation $LL/L_5>2$ can be applies to any omega-type energy filter, whether it is of A type or B type.

Furthermore, they can be applied to a diffraction image plane in observing an electron diffraction pattern, as well as to an image plane in observing an image, to reduce the difference in energy between the vicinity of the center of the image on the pupil plane and peripheral portions.

Where the distance LL from the image plane to the slit plane is large, the first lens of the lens system located behind the energy filter is a demagnifying lens. Therefore it is customary to construct the lens system placed behind the filter from a two-stage system. In this case, it is difficult to obtain a magnification of 100× or higher. Accordingly, where the distance LL from the image plane to the slit plane is great, the lens system positioned after the filter is composed of three or more stages of lenses to provide a magnification of 100× or higher.

As can be understood from the description provided thus far, the present invention provides a highly isochromatic omega-type energy filter producing good energy resolution even in a microscope image having a wide field of view by designing the geometry such that $LL/L_5>2$.

Having thus described my invention with the detail and particularity required by the Patent Laws, what is desired protected by Letters Patent is set forth in the following claims.

What is claimed is:

1. An omega-type energy filter for being positioned along the optical axis of an electron beam device comprising:

an entrance window;

an exit window aligned with said entrance window along the optical axis forming a slit plane;

magnetic fields between the entrance window and exit window, said fields comprising a first magnetic field $M_1$, a second magnetic field $M_2$, a third magnetic field $M_3$, and a fourth magnetic field $M_4$ produced in this order to deflect an electron beam into an $\Omega$-shaped orbit from said entrance window to said exit window;

said fourth magnetic field $M_4$ having an exit end surface spaced a distance of $L_5$ from said exit window; and an exit pupil plane spaced a distance of LL from said exit window; and wherein $$LL/L_5>2.$$

2. An electron microscope fitted with an energy filter as described in claim 1, wherein three or more stages of lenses are mounted behind said filter, said electron microscope providing a magnification of 100× or higher even where said distance LL is large.

3. The omega-type energy filter of claim 1, wherein a deflection angle $\Phi$ is set to 110° to 120°.

4. The omega-type energy filter of claim 1 or 3, wherein three or more stages of lenses are mounted behind said filter, said electron microscope providing a magnification of 100× or higher even where said distance LL is large.

5. The omega-type energy filter of claim 1, wherein focusing takes place three times in a zx-plane including an electron direction z in the filter and a direction x parallel to a magnetic polepiece plane, and wherein focusing takes place twice in a zy-plane including a direction y perpendicular to said magnetic polepiece plane.

* * * * *